(12) United States Patent
Clare et al.

(10) Patent No.: US 7,709,294 B2
(45) Date of Patent: May 4, 2010

(54) DIE ATTACH AREA CUT-ON-FLY METHOD AND APPARATUS

(75) Inventors: Thomas J. Clare, Media, PA (US); Andre Cote, Williamstown, NJ (US); Eric Eckstein, Merion Station, PA (US)

(73) Assignee: Checkpoint Systems, Inc., Thorofare, NJ (US)

( * ) Notice: Subject to any disclaimer, the term of this patent is extended or adjusted under 35 U.S.C. 154(b) by 1216 days.

(21) Appl. No.: 11/166,534

(22) Filed: Jun. 24, 2005

(65) Prior Publication Data

US 2005/0284917 A1  Dec. 29, 2005

Related U.S. Application Data

(60) Provisional application No. 60/582,741, filed on Jun. 24, 2004, provisional application No. 60/634,190, filed on Dec. 8, 2004.

(51) Int. Cl.
*H01L 21/00* (2006.01)
*B23K 20/00* (2006.01)

(52) U.S. Cl. .................. 438/111; 228/102; 228/105

(58) Field of Classification Search ............ 29/832, 29/835, 840, 847, 854, 25.35, 592.1, 594, 29/825, 846; 340/571–572.7; 156/25.35, 156/592.1, 594, 825, 846, 252, 253, 268; 228/8–10, 13, 43, 49.1, 49.5, 120, 160, 170, 228/171, 172, 173.6, 173.7, 102–105; 438/111, 438/113

See application file for complete search history.

(56) References Cited

U.S. PATENT DOCUMENTS 5,201,988 A * 4/1993 Matsumoto et al. ........... 216/41
5,467,914 A * 11/1995 Peterson et al. ............. 228/102
5,615,828 A * 4/1997 Stoops ....................... 228/223

(Continued)

FOREIGN PATENT DOCUMENTS

JP    2002353283    12/2002

(Continued)

OTHER PUBLICATIONS

Soldering, Brazing, Welding and Adhesives, 1978, The Institution of Production Engineers, p. 12.*

(Continued)

*Primary Examiner*—Jessica L. Ward
*Assistant Examiner*—Carlos Gamino
(74) *Attorney, Agent, or Firm*—Caesar, Rivise, Bernstein, Cohen & Pokotilow, Ltd.

(57) ABSTRACT

A method and apparatus for bonding integrated circuits uniquely suited to high volume tag production is described, where conductive material of a substrate at the die-attach-area is cut before an IC chip or transponder is placed on the conductive material over the cut and bonded. The apparatus performs the method of placing a first chip on a substrate having a conductive layer, measuring the location of the first chip on the substrate, cutting the conductive layer at a location of an expected subsequently placed chip to form a cut based on the measured location of the first chip, and placing the subsequently placed chip on the substrate over the cut.

9 Claims, 5 Drawing Sheets

U.S. PATENT DOCUMENTS

| | | | |
|---|---|---|---|
| 5,708,419 A | 1/1998 | Isaacson et al. | |
| 5,800,724 A * | 9/1998 | Habeger et al. | 216/35 |
| 5,882,720 A * | 3/1999 | Legault et al. | 427/8 |
| 6,018,299 A * | 1/2000 | Eberhardt | 340/572.7 |
| 6,147,662 A * | 11/2000 | Grabau et al. | 343/895 |
| 6,274,508 B1 | 8/2001 | Jacobsen et al. | |
| 6,641,684 B2 * | 11/2003 | Instance | 156/64 |
| 6,891,110 B1 | 5/2005 | Pennaz et al. | |
| 6,951,596 B2 | 10/2005 | Green et al. | |
| 6,972,394 B2 | 12/2005 | Brod et al. | |
| 7,062,845 B2 * | 6/2006 | Burgess | 29/759 |
| 7,066,393 B2 | 6/2006 | Stromberg et al. | |
| 7,073,246 B2 * | 7/2006 | Bhullar et al. | 29/595 |
| 7,116,227 B2 * | 10/2006 | Eckstein et al. | 340/571 |
| 7,124,956 B2 | 10/2006 | Moll et al. | |
| 7,244,332 B2 | 7/2007 | Stromberg et al. | |
| 7,245,005 B2 | 7/2007 | Moll et al. | |
| 7,250,868 B2 * | 7/2007 | Kurz et al. | 340/572.7 |
| 7,278,203 B2 * | 10/2007 | Aoyama et al. | 29/740 |
| 7,368,033 B2 * | 5/2008 | Eckstein et al. | 156/277 |
| 7,384,496 B2 * | 6/2008 | Cote et al. | 156/277 |
| 2002/0053589 A1 * | 5/2002 | Owen et al. | 228/104 |
| 2002/0168796 A1 * | 11/2002 | Shimanuki et al. | 438/106 |
| 2003/0136503 A1 * | 7/2003 | Green et al. | 156/264 |
| 2004/0140122 A1 | 7/2004 | Moll et al. | |
| 2004/0212544 A1 * | 10/2004 | Pennaz et al. | 343/795 |
| 2005/0081908 A1 | 4/2005 | Stewart | |
| 2005/0183817 A1 | 8/2005 | Eckstein et al. | |
| 2005/0184872 A1 | 8/2005 | Clare et al. | |
| 2005/0184873 A1 | 8/2005 | Eckstein et al. | |
| 2006/0137813 A1 * | 6/2006 | Robrecht et al. | 156/256 |
| 2007/0102486 A1 * | 5/2007 | Cote et al. | 228/101 |
| 2008/0120834 A1 * | 5/2008 | Laksin et al. | 29/847 |

FOREIGN PATENT DOCUMENTS

WO     WO/0021032     4/2000

OTHER PUBLICATIONS

International Search Report, PCT/US2005/022364, dated Nov. 10, 2005.

* cited by examiner

| STATION TIME | Cutting | Placement | Photo |
|---|---|---|---|
| 0 | | | |
| 1 | | Chip 1 | |
| 2 | | Chip 2 | Chip 1 |
| 3 | Chip 4 | Chip 3 | Chip 2 |
| 4 | Chip 5 | Chip 4 | Chip 3 |

| STATION TIME | Cutting | Placement | Photo |
|---|---|---|---|
| 0 | | | |
| 1 | | Chip 1 | |
| 2 | Chip 1 | Chip 2 | |
| 3 | Chip 2 | Chip 3 | Chip 1 |
| 4 | Chip 3 | Chip 4 | Chip 2 |

DIE ATTACH AREA CUT-ON-FLY METHOD AND APPARATUS

CROSS-REFERENCE TO RELATED APPLICATIONS

This application is a nonprovisional application of U.S. Provisional Application Nos. 60/582,741, filed Jun. 24, 2004 and 60/634,190, filed Dec. 8, 2004.

FIELD OF INVENTION

This invention is related to security tags, and, in particular, to bonding integrated circuits (ICs) uniquely suited to high volume tag production.

BACKGROUND OF THE INVENTION

Chip bonding is costly. The two largest components of the cost of RFID tags today are the integrated circuit and the attachment of that circuit to an antenna structure. Moore's law and increasing volume are helping to drive the IC cost down, but bonding is a mechanical process and does not benefit from the same technology advances or economies of scale.

Current methods of chip bonding do not adequately address cost. A two-step approach of an intermediary "strap" achieves incremental cost improvement by relocating the costs. However, straps do not address the problem directly, as bonding is still required, but to a smaller tag. Moreover, straps add another step to bond the strap to the big tag.

Current manufacturers using standard bonding technology with straps, want straps to be like traditional bonding surfaces, that is, hard and inflexible. But such straps do not lend themselves to easy integration into squishy flexible tags. The known standard bonding processes are all strap-based solutions, and therefore less than ideal.

One related art bonding method, called fluid self-assembly, provides insufficiently robust bonds. Because the chips find their own way into bonding sockets, the chips cannot use any adhesives or flux, since anything sticky prevents free motion of the chip into the sockets. Then the bond is made at a tangent between the chip bonding pad and the side of the bonding cavity. This flat-to-edge bond is different than and less reliable than traditional bonds, which are made flat-to-flat. As an analogous example illustrating problems inherent to flat-to-edge bonds, consider trying to stand a playing card on edge, rather than laying it flat on a table. Fluid self-assembly also places restrictions on the type of substrate that can be used. This may not be a problem for just making straps; but it is certainly a problem for foregoing the strap and putting the chip right on the tag.

A known bonding process is a gallant brute force attempt to make standard bonding faster. Instead of having one vacuum head pick up one chip and place it on one strap, a plurality of heads (e.g., 60) in lock step picks up that number (e.g., 60) of chips and puts them on that number (e.g., 60) of straps. This process suffers from the problem of keeping all of the number (e.g., 60) of chips aligned correctly at the same time.

Bonding RFID chips is more like processing diodes and resistors than processing other kinds of chips. One new RFID strap line uses a traditional tape automated bonding process, with a sprocket-fed 35 mm tape of hard straps inching its way through a traditional flip-chip placement and bonding head. At 4.75 mm pitch, four lanes wide, and 10,000 chip bonds per hour, their tape advances through the bonding procedure at about 0.65 feet per minute. It would be beneficial if a chip bonding process could produce more bonded chips in less time.

In order to consider why the art has not bonded chips as exemplified by the preferred embodiments of the invention discussed below, it may help to compare standard electronic chip components to RFID tags. Standard electronic chip components are known and generally found on printed circuit boards. A bare IC is bonded to a carrier by wire bonding or flip chip. Then a package is molded around the carrier and chip. The package is then put onto a printed circuit board via thru-hole or surface mount assembly. In summary, typical standard chip components: need to be compatible with multiple PCB assembly technologies, including solder baths, solder waves, IR reflow, and a variety of cleaning and baking steps; want more and more computational power put in single chip assemblies; and are made to last. In contradistinction, RFID tags: are never soldered or baked or cleaned; are complete unto themselves and do not have to be integrated into any other system; want the bare minimum computational power to minimize cost and energy consumption (which translates into read distance); and do not face the same power dissipation or environmental requirements as standard chips.

To meet their design requirements, standard chip assemblies usually start with relatively stiff and heavy substrates, at least compared to RFID tags. Ceramics and fiberglass are common. These are meant to be tough and resistant to thermal influences. Usually the standard chip substrates are etched. Laser cutting is expensive because the standard chip substrates are thick and have high thermal masses.

RFID tags are substantially different. The metal layer is thin and flexible (or non-rigid) by comparison. The back or substrate of each tag is soft polypropylene or paper. The substrates are easily to punch, cut, dimple, and weld. The preferred embodiments of the invention reinvent bonding taking advantage of these different properties.

A known wire bonding process is disclosed in U.S. Pat. No. 5,708,419 to Isaacson, et al., the contents of which are incorporated by reference herein in its entirety. Isaacson discusses the bonding of an IC to a flexible or non-rigid substrate which generally can not be subjected to high temperatures, such as the temperature required for performing soldering processes. In this wire bonding process, a chip or die is attached to a substrate or carrier with conductive wires. The chip is attached to the substrate with the chip front-side face up. Conductive wires are bonded first to the chip, then looped and bound to the substrate. The steps of a typical wire bonding process include:

1. advancing web to the next bond site
2. stopping
3. taking a digital photograph of the bond site
4. computing bond location
5. picking up a chip
6. moving the chip to the bond site
7. using photo feedback to adjust placement to the actual site location
8. placing or depositing chip
9. photographing the chip to locate the bond pads
10. moving the head to the chip bond pad
11. pressing down, vibrating and welding conductive wire to the bond pad
12. pulling up and moving the chip to the substrate bond pad, trailing wire back to the chip bond
13. pressing down and welding that bond
14. pulling up and cutting off the wire; and
15. repeating steps 10-14 for each connection In contrast, the interconnection between the chip and substrate in flip-chip packaging is made through conductive bumps of solder that are placed directly on the chip surface. The bumped chip is then flipped over and placed face down, with the bumps electrically connecting to the substrate.

Flip chip bonding, a current state of the art process, is expensive because of the need to match each chip to a tiny, precision-cut bonding site. As chips get smaller, it becomes even harder to precisely cut the bonding site. However, the flip-chip bonding process is a considerable advancement over wire bonding. The steps of a typical flip-chip bonding process include:

1. advancing web to the next bond site
2. stopping
3. photographing the bond site
4. computing the bond location
5. picking up the chip
6. moving the chip to the bond site
7. using photo feedback to adjust placement at the actual site location
8. placing the chip
9. ultrasonically vibrating the placement head to weld chip in place; and
10. retracting the placement head Steps 1 through 8 of each of the above bonding processes are substantially the same. The web must stop to locate the conductive gap in the substrate and precisely place the IC. The related art processes require that the web is stopped and measured (e.g., photographing the bond site, containing the bond location, using photo feedback to adjust placement at the actual site location) so that the chip can be accurately placed as desired adjacent the gap and bonded.

In designing an efficient chip placement process that can be integrated into RFID tags, the inventors discovered that it is beneficial to avoid anything that is not consistent with a continuous rolling printing press. Stopping and starting the line always slows things down. It would be beneficial to adjust tooling to operate on a chip that is continuously advancing down the line at a known rate of travel.

Retracing a path during the bonding process takes time, causes vibration, and wears mechanical linkages. These linkages also create uncertainty in absolute position. Rotating or continuous devices are thus preferred over reciprocating devices.

The greater the number of mechanical connections in a bonding process, the less certainty there is in precise position. Every jointed or flexible linkage introduces a certain amount of randomness as the web and chips wiggle around. IC dimensions are tiny. It does not take a lot of mechanical links to move chip placement out of critical alignment.

With security tags, you cannot rely on any precise dimension set previously. The relative position of things varies across the web, from one end of the roll to another, from place to place, and from time to time. That is simply the reality of working with inexpensive materials. For IC bonding processes, the manufacturer must constantly adapt to how the material is really behaving, rather than counting on it to behave as intended.

BRIEF SUMMARY OF THE INVENTION

An integrated circuit bonding process according to the preferred embodiments provides:

A high quality and high reliability integrated circuit attachment to a tag or strap;

Bonding speeds compatible with flexographic printing lines, and thereby suitable for integration in current and foreseeable tag production lines; and Low total bond costs, for example, of less than $0.01 at production volumes.

While not being limited to a particular theory, the preferred embodiments of the present invention illustrate approaches for cutting a bond site and assembly placing a chip (e.g., transponder) at the bond site without stopping the web. That is, the chip substrates move continuously during the chip placement process. In a first preferred embodiment, the bond site is cut to form a gap where a chip is expected to be placed. According to a second preferred embodiment, the bond site is cut to form the gap simultaneously with or after the chip is placed. According to the preferred embodiments of the present invention, a manufacturer can achieve bonding rates for tiny chips 100 times faster than the conventional technology, in particular, by applying the bonding process on chip substrates moving continuously at a speed normally applicable to high speed printing presses in the flexographic process range of up to at least about 300 feet per minute.

BRIEF DESCRIPTION OF SEVERAL VIEWS OF THE DRAWINGS

The invention will be described in conjunction with the following drawings in which like reference numerals designate like elements and wherein.

DETAILED DESCRIPTION OF PREFERRED EMBODIMENTS OF THE INVENTION

Figures 1, 2:
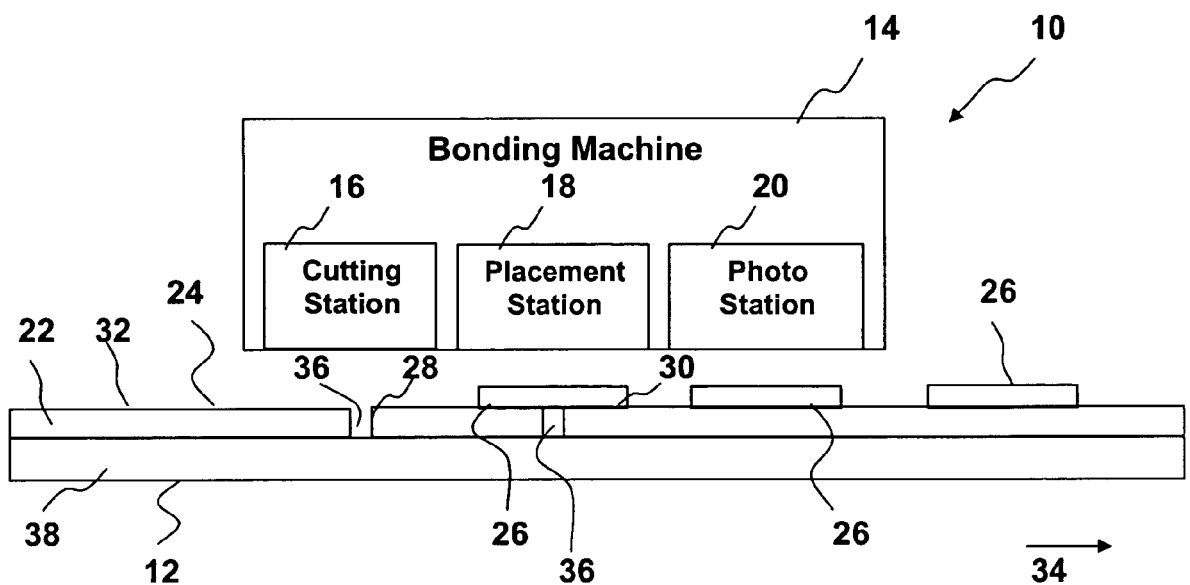
FIG. 1 shows a table of chip locations during a time sequence in accordance with the preferred embodiments of the invention.
FIG. 2 illustrates a structural representation of a cut-on-fly apparatus in accordance with the preferred embodiments.

According to the preferred embodiments, RFID chips are bonded on soft, mutable substrates. The chips are prepared for bonding according to known chip prepping methods. As one example, the chips are topped with quartz—silicon dioxide—with little windows etched down to aluminum contact pads. These contact pads are "bumped" with solder by either sputtering the solder on or running the wafer across a solder wave bath. The solder sticks to the aluminum and slides away from the quartz.

The preferred bonding process starts with a completed silicon wafer, which contains thousands of integrated circuits (ICs) etched into a single plate of silicon material. The completed silicon wafer is cut into hundreds of the individual chips, with each chip including an IC and its corresponding section of the silicon plate.

Wafers with big chips (e.g., 0.25 in$^2$ to 1.0 in$^2$) on them are normally cut apart with delicate diamond saws. In comparison, RFID chips are really, really tiny (e.g., 50 μm×100 μm), and sawing the wafer apart is not economical. For RFID chips, the wafer is grinded on the backside to make the wafer as thin as possible while being supportive as desired. Then the thinned wafer is masked with acid-resist for protection, except in the places of the wafer that we want to cut. This is known as a standard wafer operation.

Next the whole wafer is dipped in acid. The acid eats away the unprotected silicon between chips until the wafer breaks apart into thousands of chips. Using a strainer to keep the chips from flushing away, the acid is rinsed out of the bath leaving thousands of RFID chips floating in a bottle of water. The chips are poured out of the solution and dried. Using this standard technology, a wafer is separated into numerous chips without frictional (e.g., saw) cutting.

Most chip bonding processes struggle to either get the chip lined with the substrate or get both the substrate and the bond site lined up. However, the preferred embodiments do not need that same level of precision as previously required for chip placement. While not being limited to a particular theory, the preferred bonding approach described in greater detail below just needs to get all the chips facing about the same direction.

A shaker table, as known in the art, accomplishes the goal of chip orientation. To begin, a jumble of chips is placed on a funnel-shaped shaking table leading to a small square or rectangular (e.g., tens hundreds, thousands) alignment tube. The chips are typically substantially box-like rectangular prisms, possibly having slanted sides from the etching process. The chips are shaken into the tube, ending up in one of eight orientations. Then a picture of the shaker chips is taken. If a chip is in the right orientation, it continues down the tube. If a chip is not in the correct orientation, then the disoriented chip is kicked back onto the shaker table for another orientation attempt. Eventually all the chips end up in the tube in the right orientation.

In stark contrast to prior art approaches that prepare the bond site for the IC before the substrate goes into the bonding machine, the preferred approach of this invention lets the bonding machine itself make the cut. What goes into the machine for the bonding site is solid metal. For example, the metal is preferably a thin strip of metal film on a strap, a web of tags, packaging material, or a product. The important thing is that, according to the preferred embodiments, the bond site is not prepared (e.g., formed with a conductive gap) before the metal is input to the bonding machine. According to the preferred embodiments, what goes into the bonding machine is a blank metal strip, ready to be cut for its particular chips.

It is understood that a shaker table is one of various approaches to accomplish chip orientation before chip placement at a bond site, and that the invention is not limited to this particular approach. In fact, the preferred cut-on-fly method is applicable to a chip attached to its substrate, or to a chip about to be attached to its substrate, or to a chip being attached to its substrate. Accordingly, the manner in which the chip is attached to its substrate is not a limiting factor to the preferred methods for cutting the substrate, as long as the chip is attached or oriented for attachment to the substrate, as discussed, by example, in greater detail below. Another approach that accomplishes chip orientation, for example by formation of the chip on a metal substrate is disclosed in U.S. application Ser. Nos. 10/996,786, entitled "Tag and System for Fabricating a Tag Capable of Including an Integrated Surface Processing System"; 10/996,785, entitled "A Tag Having Patterned Circuit Elements and a Process for Making Same"; and 10/996,939, entitled "A Method for Applying an Identification Marking to an Item to Identify the Item in Response to an Interrogation Signal", all filed on Nov. 24, 2004, the disclosure of which is incorporated by reference herein in its entirety.

Now it is not enough that the machine makes a cut. The cut must form a conductive gap in the metal strip. That is, the conductive strip or substrate material must be removed completely at the gap to avoid the risk that it will short out the chip later. There are at least two-ways to down this. One is called a "kiss cut" achieved with cutting blades. Another is ablation with a laser—literally vaporizing the unwanted metal. Lasers are preferred because laser cutters can make a precise cut without bringing anything mechanical in touch with the substrate. But, whether by kiss cut, laser or an equivalent approach (e.g., wafer), the bonding machine of the preferred embodiments can make this cut without ever slowing the web down. That is, the web is continuously moving when the gap is formed by the cut, and during chip placement, for example, at flexographic printing speed. Moreover, the cut is made within the tolerance allowed by small RFID chips having a size of, for example, about 100 microns or less. The tolerance allowed to create a gap between contact points of the chip is less than about 80 microns, and more preferably, less than about 20-30 microns.

The preferred examples of the embodiments discuss the invention with relation to chips (e.g., transponders) having two conductive pads requiring electrical connections to an antenna at a die attach site with a gap formed from a single cut. It is understood, however, that the invention is not limited to that scope, as the preferred embodiments apply to other types of chips (e.g., multi-padded chips) as well. Of course, multi-padded chips need more cuts, which is easily provided, especially using laser cutters, which can cut the conductive substrate or carrier in a preconfigured pattern as desired.

The width of the cut, in particular a laser cut, is largely a function of the pattern and the magnitude of energy applied. The width is also a function of the thickness of the conductive substrate, as the thicker the substrate, the more difficult it is to get a clean narrow cut. Using pulse control laser cutting, femto second resolution is possible. For micromachining, water saws are another preferred approach for cleaning the kerf. Regardless of the cutting approach, the preferred cut width is about 5 μm or less.

To avoid wimpy unstable bonds, the bonding machine of the preferred embodiments welds the chips to the substrate. The preferred bond is with a solder weld, and for that it is nice to use flux, perhaps even acid flux. There is no need for exact precision. Flux is simple squirted over the bond area for each solder weld. The flux forms a pre-defined boundary that solder bumps (e.g., flip, chip, controlled chip collapse) of the chip don't go beyond. The solder bumps adhere to the flux and orient to the metal along the web direction.

Figure 3:
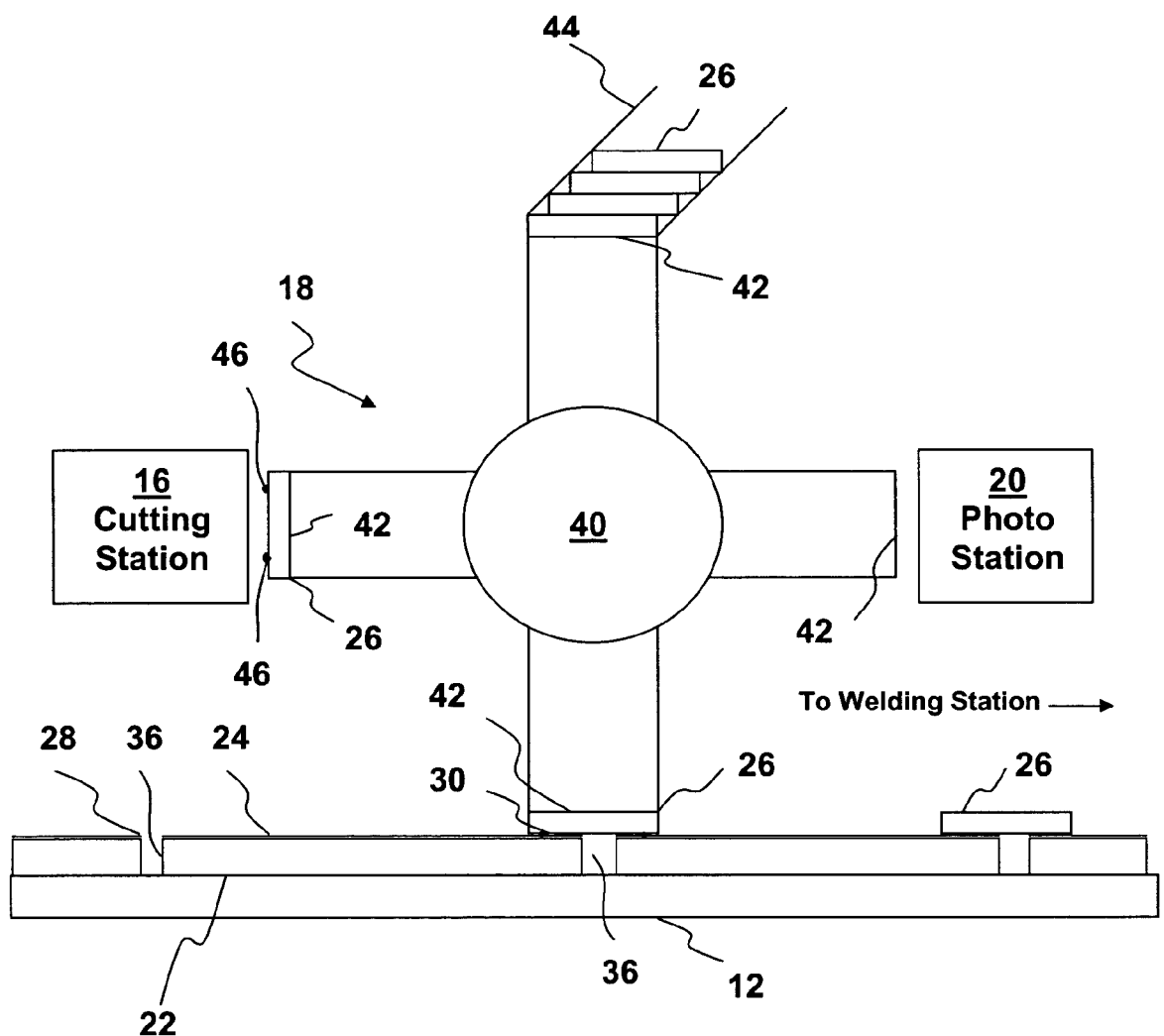
FIG. 3 illustrates a chip placement approach in accordance with the preferred embodiments of the invention.

There are various approaches to transfer the chips (e.g., transponders) from the alignment tube of, for example, a shaker table, to the sticky flux over the bond area as the web goes by. One approach for depositing or placing chips is to tip the chips on, letting the chips contact the moving flux such that a leading end of the chips stick to and get pulled out by the flux, one at a time. Another approach is to shoot the chips onto the flux with air pressure. A preferred approach is to stick the aligned chips with a rotating wheel of vacuum heads. For example, as shown in FIG. 3, each head sucks a chip out of the alignment tube at the top of the wheel's turn, and blows it onto the bond site on the bottom of its turn. It is preferable to place or deposit the chip upside down in the flux, so that the chip's solder bumps are pressed right into the conductive material (e.g., metal strip) for connection at the bonding site.

While not being limited to a particular theory, the chip placement can be achieved without slowing the web down to place the chips. The web keeps whizzing by, and the bonding machine places a chip onto the moving web as desired, for example, every time an available chip flux spot shows up. This approach for chip bonding on soft substrate thus is more like mechanical assembly processing than like anything used in standard IC processing.

Next, in the preferred embodiments, a picture is taken to determine where the chip landed. From that picture the bonding machine can compute where it should or should have cut the metal strip to make the bonding site for that chip. That is, this photo information can be used to determine where to make the cut after the chip is placed. As discussed in greater detail below, the photo information can also be used to cut the conductive material (e.g., metal strip) at the bond site before the chip is attached to the conductive material.

The preferred approach described herein creates a conductive gap in the antenna right where the chip is sitting or expected to sit. The most preferred embodiments take the information of where this bond site should be, and uses this information to cut the bond site for a chip that has not been placed onto its bond site. In other words, the optical or alignment feedback of a placed chip is used to determine and cut the bond site for a subsequent pre-bonded chip (e.g., the next chip) yet to be placed.

The preferred embodiments use photo feedback because while the chips do not change in dimension, the substrates do change—especially soft substrates. On a roll of tags, which may be made in one location (e.g., Puerto Rico) and bonded in another location (e.g., Sweden), the difference in the location of a pre-cut bond site from one end of the roll to the other end is much larger than reasonably allowable for the chips. Webs and rolls stretch; machines wobble; components heat up and expand. Thus when a tag is brought into a bonding machine, the bonding machine does not know and cannot predict exactly where the bond site will be. However, if the bonding machine knows where the last bond site should have been, there is no substantial error in placing the current or next bond site there. In other words, there is no substantial error in placing a next or subsequent chip based on the location of a previous chip.

In fact, the difference between one, two, three, or maybe even ten bond sites in a row is small (e.g., almost zero, nearly identical in placement) and insignificant as within the allowable margin of error between the contact pads of the chips (e.g., about 10 to 30 μm). So it is not necessary for the bonding machine to place a chip based on the photographed location of the previous chip. The bonding machine has more time to process the photo and can use the photo of a deposited chip to place a subsequent chip several chips removed from the photographed chip. The cutting device just makes the cut that much longer before the photo step. However, the little errors add up, for example, 50 tags later the cutting device may not make the right cut between the expected location of the contact pads with certainty. With a million tags on a roll, there is no way that one cut position is right for all of the chips.

Accordingly, the most preferred embodiments of the invention use alignment feedback. The inventors have discovered that a preferred way to use alignment feedback is to locate a deposited chip to make the cut for a subsequent chip before that subsequent chip is placed. It is understood that the invention is not limited to a placement machine that uses photo feed back. In fact, as will be described in greater detail below, alignments can be accomplished by approaches other than photo. For example, the placement of a chip and cutting of the die attach area could be aligned based on the placement of the flux.

After the chips are deposited on to their respective bond site, they are welded to the metal substrate. Solder welds are preferred because they do not corrode, they provide mechanical strength, and they form a metallurgical bond for superior conduction. That is, a closer weld provides a high quality and highly reliable conductive attachment. The preferred soldering technique is a type of flip-chip soldering known as controlled chip collapse.

In the preferred embodiments, the solder is present as bumps on the chip placed onto the flux. Heat is applied to the solder, but not too much heat. The preferred amount of heat is sufficient to get the surface of the flux and substrate adjacent the flux hot, and liquefy the solder, but not to burn or deform the substrate. The substrate is soft, possibly with a plastic layer if the bonding machine is bonding to an etched tag, so excessive heat should be avoided. Flash fusing (e.g., with a xenon bulb) is preferred for the solder weld. Xenon tube flash fusing is currently used, for example, in laser printers.

It is understood that there are numerous possible bonding methods and the invention is not limited to a particular approach. For example, an alternative bonding approach to controlled chip collapse is with the use of anisotropic conductive adhesives.

A preferred embodiment for bond site formation is exemplified in FIGS. 1-3. FIG. 1 shows a table of chip locations during a time sequence, and FIG. 2 shows a structural representative of a cut-on-fly apparatus 10. As can best be seen in FIG. 2, a substrate 12 moves under a bonding machine 14 from a cutting station 16 to a placement station 18 and then to a photo station 20. In this example, the cutting station 16 cuts a conductive layer 22 of metal and flux 24 at an estimated die attach area 28. The placement station 18 places a chip 26 onto the substrate 12 at a bond site 30, which includes the conductive layer 22, preferably at each time period, as will be discussed in greater detail below. The photo station 20 measures the location of a chip 26 to determine the location of a subsequent die attach area 32 that is to be cut. While not being limited to a particular theory, the photo station 20 is preferably a flash vision system that looks for an edge (e.g., front edge, rear edge) of each chip 26 passing by to determine the location of each chip.

Referring to FIGS. 1 and 2, at Time 1, Chip 1 is placed at the bond site 30 on the conductive layer 22 of the substrate 12 as the substrate continuously moves down the line along a processing direction 34. At Time 2, which is subsequent to Time 1, Chip 1 is moved to the photo station 20 where a measurement of the chip's location is made, and Chip 2 is placed at the bond site 30 on the conductive layer 22 of the substrate 12 at the next die attach area. Based on the measurement of Chip 1, the system (e.g., bonding machine 14) preferably determines where subsequently placed chips 26 should be placed on the substrate 12. As one of ordinary skill in the art would readily understand, the position of the subsequently placed chip 26 can be determined from knowledge of the location of Chip 1 on the substrate 12 and the distance between successive chip placement locations. The distance between successive chip placement locations is understood as a function of the delta in time between chip placements and the speed of the non-stopping and non-reciprocating substrate 12 moving along the processing direction 34. The placement of each cut through the conductive layer 22 is between the estimated locations of where the conductive contact points of each deposited chip 26 will be located, that is, at the estimated die attach area 28, and is preferably midway between the contact points, which may be separated by microns (e.g., less than 10 μm to about 100 μm and most preferably between about 10 μm and 20 μm). Therefore, the dimensions of the chip 26 and its contact points should also be known in determining the cutting locations for subsequently placed chips.

Accordingly, based on the measurement of Chip 1's location, the bonding machine 14 determines where a subsequent chip should be placed and at Time 3 cuts the conductive layer 22 at the estimated die attach area 28 to form a gap 36 and an antenna for a subsequently placed chip. Since the substrate 12 is moving, at Time 3, which is subsequent to Time 2, Chip 1 is moved beyond the photo station 20, Chip 2 is at the photo station, and a new chip, Chip 3, is placed on the substrate 12 at the bond site 30 by the placement station 18. It should be noted that a cutter could also be used to cut the conductive layer under a chip 26 at other locations of the bonding machine 14, as will be described in greater detail below in conjunction with other preferred embodiments of the invention. However, in the most preferred embodiments, the conductive layer 22 is cut before the chip 26 is placed, which does not expose the chips to possible damage caused by cutting of the conductive layers, since the chips have not been placed and thus are not in danger from being damaged by the cutting station 16.

Still referring to FIG. 1, the substrate 12 continues down the line along the processing direction 34 and at Time 4, which is subsequent to Time 3, Chip 3 is at the photo station 20, where, if desired, the chip can be measured to determine the estimate die attach area 28 for a subsequently placed chip, as described above. Still at Time 4, the placement station 18 deposits Chip 4 at the bond site 30 on the substrate 12 over the gap 36 in the conductive layer (e.g., metal and flux layers) previously made at the cutting station 16. At this Time 4, the cutting station 16 cuts the conductive layer 22 to form the gap 36 for another subsequently placed chip (e.g., Chip 5).

FIG. 2 is an example illustration showing chip 26 and substrate 12 location under a bonding machine 14 at Time 4. While the photo station 20 is shown adjacent the placement station 18, it is understood that the photo station can be located elsewhere along the line, as desired to accurately measure chip location for determination of subsequent cutting locations. The position of the photo station 20 may differ, for example, depending on the amount of time needed to measure and estimate subsequent die attach areas for chip placement. Accordingly, it is within the scope of the invention for the photo station 20 to be located anywhere after the placement station 18 down the line, as long as the photo (or measuring) station can measure the location of a deposited chip 26. In a similar manner, it is understood that while the cutting station 16 is shown above a die attach area 28 adjacent the placement station 18 and the bond site 30, the cutting station may be separated from the placement station by more than one placement intervals, where each placement interval is represented by the distance between successive die attach areas (e.g., consecutive chip placements).

As shown in FIG. 2, a first chip 26 (e.g., Chip 2) is located beyond the photo station 20, a second chip 26 (e.g., Chip 3) is located under the photo station, and a third chip 26 (e.g., Chip 4) is shown under the placement station 18 at the bond site over a gap 36 in the conductive layer 22 previously made by the cutting station 16. Another gap 36 in the conductive layer 22 is shown under the cutting station 16 at the estimated die attach area 28 for the next chip (e.g., Chip 5). It is understood that with this approach, the first three chips 26 in the process can not be used as a transponder since the conductive layer 22 under the chip has not been cut to remove the short and form an antenna. However, the loss of three chips 26 in a line is an insignificant sacrifice for the hundreds and thousands of subsequently placed chips that are safely and reliably made after the process begins.

FIG. 3 illustrates a preferred approach to placing the chips 26 down into the sticky flux 24 as the web goes by. FIG. 3 shows a rotating wheel 40 with vacuum heads 42 at the placement station 18. Each head 42 sucks a chip 26 out of a tube of aligned chips 44 at the top of the wheel's turn and blows the chips onto the bond side 30 at the bottom of its turn. Preferably, with the chips 26 placed upside down in the flux 24, the chip's solder bumps 46 are placed right into the conductive layer 22 for the conductive connection. Each chip 26 placed onto its bond site 30 continues with the substrate 12 to the photo station 20, and the welding station which solders the bond, for example, as discussed above.

Figures 4, 5:
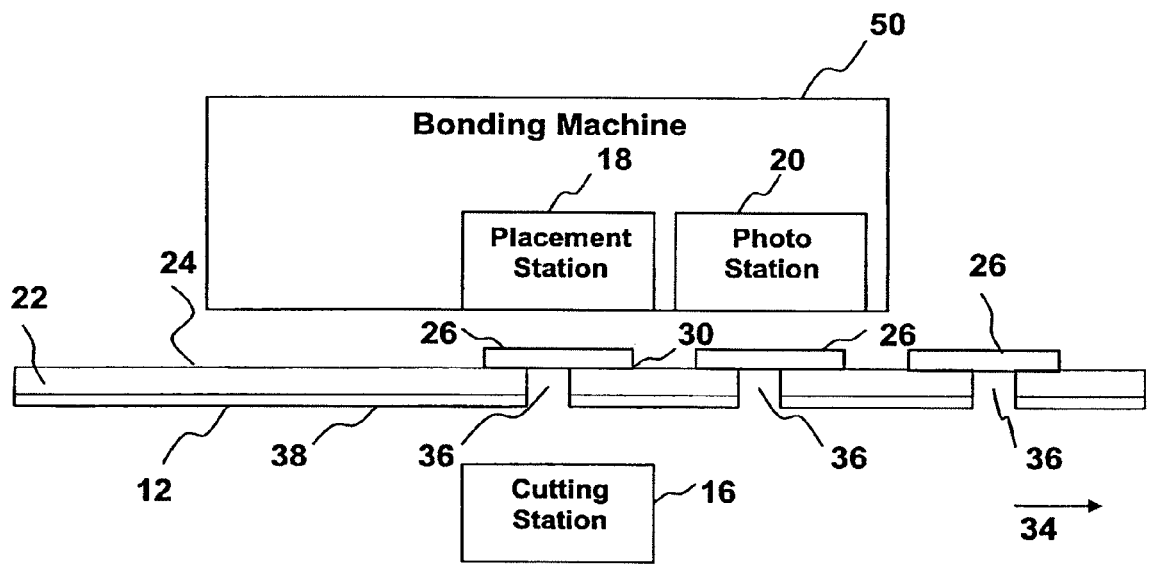
FIG. 4 shows a table of chip locations during a time sequence in accordance with the preferred embodiments of the invention.
FIG. 5 illustrates a bonding machine in accordance with the preferred embodiments.

A first example of the second preferred embodiment for bond site formation is exemplified in FIGS. 4 and 5. In this example, the metal substrate is cut at the bond site of each chip to form the conductive gap simultaneously with the placement of each respective chip on to the substrate. FIG. 4 shows a table of chip locations during a time sequence. As can best be seen in FIG. 5, the substrate 12 moves continuously under the bonding machine 14 in the direction of travel 34. The bonding machine 50 is similar to the bonding machine 14 shown in FIG. 2, as both bonding machines include the cutting station 16, placement station 18 and photo station 20. However, the cutting station 16 is positioned to cut the substrate 12 and its conductive layer 22 from the opposite side of chip placement, or bottom of the substrate 12, instead of from the top of the conductive layer 22. Moreover, it should be noted that the photo station 20 is not critical to the operation of the bonding machine 50 as will be discussed in greater detail below.

In this example, the cutting station 16 is designed to cut the substrate 12, including the metal layer 22 at substantially the same time as the placement station 18 places the respective chip 26 at the bond site 30. Since the bonding machine 50 knows when and where the placement station 18 places the chip 26, the bonding machine aligns the cutting station 16 opposite the placement station to cut the substrate 12 and conductive layer 22 at the time and location of the respective chip placement. In other words, in this example of the preferred embodiments, each respective chip 26 is placed on the substrate 12 and the substrate 12 is cut at substantially the same time. Since a chip is at the bond site 30 during the cutting, it is understood that the cutting station 16 cuts the substrate 12 with a cutting member (e.g., laser, blade, water) sufficient to cut the substrate but not interfere with the operation or function of the respectively placed chip 26.

The photo station 20 measures the location of each chip 26 after it is placed and cut as a check that the chip has been properly placed. In doing so, the photo station 20 provides photo feedback for the bonding machine 50 to ensure alignment between the placement station 18 and cutting station 16. If a measured chip is not aligned with its respective gap (e.g., the gap 36 is not between contact points of the chip), then the bonding machine 50 can adjust the cutting station 16 or the placement station 18 as needed to realign the stations for simultaneous cutting of the substrate 12 with placement of each chip 26 in a manner known to a skilled artisan.

As noted above, FIG. 4 shows a table of chip locations during a time sequence in accordance with this example of the preferred embodiments. Referring to FIGS. 4 and 5, at Time 1, Chip 1 is placed at the bond site 30 along the processing direction 34 on the conductive layer 22 of the substrate 12 as the substrate continuously moves down the line. At this same Time 1, the substrate 12, including the conductive layer 22 is cut under the chip 26 at the bond site 30, preferably between the chip's contact points (e.g., solder bumps 46) to form an antenna for the chip. At Time 2, which is subsequent to Time 1, Chip 1 is moved to the photo station 20 where a measurement of the chip's location is made, Chip 2 is placed at the bond site 30 on the conductive layer 22 and the conductive layer and substrate 12 are cut under Chip 2. Based on the measurement of Chip 1, the bonding machine 50 can determine if Chip 1 has been properly placed and if any further adjustments between the placing and the cutting is needed. The placement of each cut by the cutting station 16 through the conductive layer 22 and substrate 12, for this example, is at the known location of where the placement station 18 places the respective chip 26, and is preferably midway between the contact points of the respective chip. The dimensions of the chip 26 and its contact points should be known in determining the cutting locations for each chip, that is, where the conductive gap 36 should be formed.

It should be noted that while each conductive gap 36 is shown in the figures of all of the examples as substantially perpendicular to the substrate 12, the gap is not limited to a particular shape or angle. The critical feature of the gap 36 is that it forms a conductive gap in the conductive substrate 22 between the contact points (e.g., solder bumps 46). In fact, depending upon the speed that the substrate 12 is moving down the line, and the speed in which the cutting station forms the gap (e.g., laser, blade, water), a side sectional view of the tags may show gaps that are non-perpendicular to the substrate, as would readily be understood by a skilled artisan.

Still referring to FIGS. 4 and 5, at Time 3, which is subsequent to Time 2, Chip 2 is moved to the photo station 20, and Chip 3 is placed at the bond site 30 where a conductive gap 30 is formed in the substrate 12 by the cutting station 16. At a later Time 4, Chip 3 is moved to the photo station 20 and Chip 4 is placed at the bond site 30 by the placement station 18 while a gap 36 is formed in the substrate under the Chip 4 by the cutting station 16. In this example of the preferred embodiment shown in FIG. 5, the photo station 20 is shown adjacent and down the line from the placement station 18. The location of the photo station 20 in FIG. 5, while down the line (e.g., after) the placement station 18, is not limited to a preferred closeness to the placement station as the photo station 20 provides photo feedback as a check to insure that the placement station 18 and cutting station 16 are attaching the chips 26 and forming the gaps 36 as desired. Accordingly, it is within the scope of the invention for the photo station 20 to be located anywhere after the placement station 18, as long as the photo (or measuring) station can measure the alignment of the deposited chips. In addition, the photo station 20 could be configured to measure the alignment from an angle offset from a top view shown in the figures to a side or perspective view within the scope of the invention as readily understood by a skilled artisan.

Figures 6, 7:
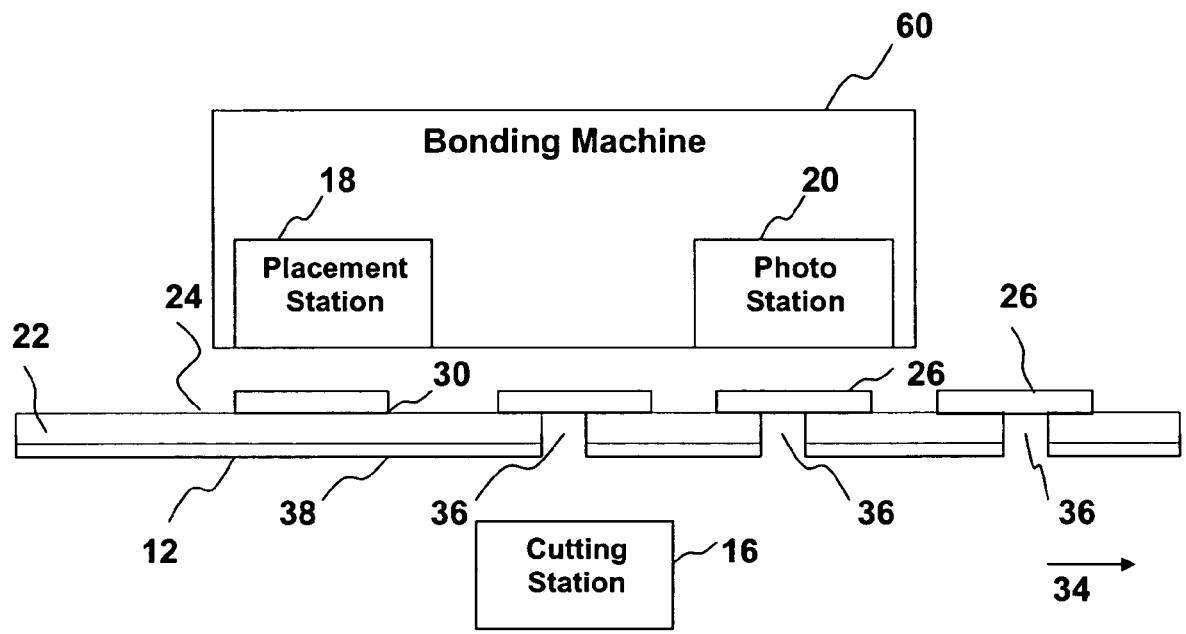
FIG. 6 shows a table of chip locations during a time sequence in accordance with the preferred embodiments of the invention.
FIG. 7 illustrates a structural representation of the placement and cutting approach in accordance with the preferred embodiments.

Another example of the preferred embodiments for bond site formation is exemplified in FIGS. 6 and 7. FIG. 6 shows a table of chip locations during a time sequence similar to the tables shown in FIGS. 1 and 4. FIG. 7 shows a structural representative of the placement/cutting process and is similar to the representatives shown in FIGS. 2 and 5. In this example, as can best be seen in FIG. 7, the substrate 12 moves along a bonding machine 60 from under the placement station 18 to over the cutting station 16 and under the photo station 20. The bonding machine 60 is similar to the bonding machine 14 shown in FIG. 2 and the bonding machine 50 shown in FIG. 5. However, the relative locations of at least the placement station 18 and cutting station 16 differ.

In this example of the preferred embodiments, the chips 26 are placed on the conductive layer 22 of the continuously moving substrate 12 before the cutting station 16 cuts the gap 36 under the respective chip 26. In other words, the placement station 18 places a chip 26 onto the conductive layer 22 at a bond site 30. Since the bonding machine 60, via the placement station 18, places the chip 26 on to the substrate 12, the bonding machine knows and can register the location of each placed chip, and can thus determine the location of the chip as it moves on the substrate in the machine direction 34. Alternatively, the location of the placed chips can be registered in accordance with the pre-registered location of the flux 24 onto which each chip is placed.

The cutting station 16 forms a gap 36 under each chip 26 subsequent to the placement of the chip by the placement station 18 based on the known location of the placed chip 26 and speed of the substrate 12 down the line. The photo station 20 is substantially similar to the photo station discussed with regards to FIG. 5, as it provides photo feedback for the chip placement for future adjustments, if necessary to maintain the location of the corresponding gaps 36 within the contact points (e.g., solder bumps 46) of each chip.

Referring to FIGS. 6 and 7, at Time 1, Chip 1 is placed at the bond site 30 on the conductive layer 22 of the substrate 12 as the substrate continuously moves down the line along the processing direction 34. At Time 2, which is subsequent to Time 1, Chip 1 is moved over the cutting station 16 where the cutting station cuts the conductive layer 22 to form the gap 36 and create an antenna for the chip. Also at Time 2, Chip 2 is placed at the bond site 30 on a conductive layer 22 at the next die attach area. As discussed in greater detail herein, the cutting station 16 cuts the conductive layer 22 and substrate 12 preferably with a laser cutter, although the invention is not limited to this form of cutting, as other approaches may be used, for example, a kiss cut with a blade, or water jets.

Still referring to FIGS. 6 and 7, at Time 3, which is subsequent to Time 2, Chip 3 is placed at the bond site 30 on the conductive layer 22 of the substrate 12 as the substrate continues on its non-stopping, non-reciprocating, continuous motion. Chip 2 is moved to the cutting station 16, which cuts the substrate 12 and its conductive layer 22 under Chip 2 to form a gap 36 under Chip 2. In this example of the preferred embodiments, still at or about Time 3, Chip 1 is moved to the photo station 20 where a measurement of the chip's location is made for feedback purposes (e.g., chip alignment, cut alignment).

The substrate 12 continues down the line along the processing direction 34 and as shown in FIGS. 6 and 7 at Time 4, Chip 4 is placed on the substrate by the placement station 18, Chip 3 is moved to above the cutting station 16, which cuts a gap 36 in the substrate and conductive layer 22 between the contact points of Chip 3 to form an antenna; and Chip 2 is moved to the photo station 20, where, if desired, the chip can be measured to determine chip and/or cut alignment for the placing and cutting of future chips. Still at Time 4, Chip 1 has moved beyond the photo station 20, where, if needed, the chip heads toward a welding station for welding the chip to the metal substrate 22.

While the welding station, which as known in the art, is typically part of the die attachment process, it is understood for all of the preferred embodiments that the welding station may be part of the bonding machine or separated from the bonding machine as desired within the scope of the invention. After passing through the welding station, the welded tag, now including the chip and antenna, is removed from the substrate in a manner well known to those skilled in the art. It is understood that the welding station and tag removal from the substrate are also typically carried out for the other examples of the preferred embodiments disclosed herein. It should also be noted that while the disclosed examples discuss one line of chips, it is understood that this process is applicable to numerous rows of chips placed on a substrate band having a width sufficient for the placement of a plurality of chips placed and attached side by side on the substrate. In this manner, many times more chips can be processed than for a bonding machine that only attaches one row of chips, one chip at a time. Accordingly, the bonding machines of the preferred embodiments are adapted to orient, place, cut and attach a plurality of rows of chips to a substrate simultaneously for a better output.

In the preferred embodiments, chips are attached to a conductive layer 22 of a substrate 12. Preferably, the substrate 12 includes both a conductive layer 22 and a non-conductive layer 38 preferably with an adhesive therebetween to adhere the conductive and non-conductive layers. In addition, the photo stations that provide alignment feedback are preferably flash vision systems that look for the front edge, back edge, and/or side edges of chips passing on the substrate to determine if the chips are properly aligned.

Preferably the cutting station 18 of the preferred embodiments cuts the conductive layer and substrate on an angle proportional to the speed of the travel of the web so that the translated gap is trapezoidal with sides as close to perpendicular with the attached chip as is allowable due to the speed of the web and cutting system used. Regarding cutting systems, one advantage of laser over a mechanical cutter is that laser does not use a shearing action. Instead it ablates the metal in the gap. Thus the laser cut is not going to short out or cause stress and structural problems to the tag. While not being limited to a particular theory, the type of laser preferred is a laser or other cutting system that is appropriate for creating the gap in a substrate and the conductive layer (e.g., metal, aluminum), regardless of the type of adhesive (e.g. copper, conductive paste) adhering the conductive and non-conductive layers of the substrate. Such lasers may include but are not limited to a yag laser, an opium laser, a three electron laser, etc.

The flux is an acid which acts as a wetted surface which can be printed as stripes across the conductive layer. According to the preferred embodiments, the chip gets placed on the flux and with heat, the solder balls or bumps melt a little bit, the flux flows, and the chip orients with the flux. Therefore, the printing of flux allows the placed chips to be registered in the machine direction, with the flux setting a predefined boundary and creating both an electrical and mechanical bond with the chip via the solder bumps. While controlled chip collapse is one preferred approach for attaching the chip to the substrate, another approach is a standard flip chip, where instead of a flux on the substrate and solder or tin lead balls on the chips, the standard flip chip process attaches conductive bumps (e.g., palladium) from the contact pads of the chips to an esotropic adhesive placed on the conductive layer, and the same or similar registration and orientation between the chip and the substrate takes place, as understood by a skilled artisan. Like the flux, an esotropic adhesive can be pre-printed adhesive within the scope of the invention.

Figures 8, 9:
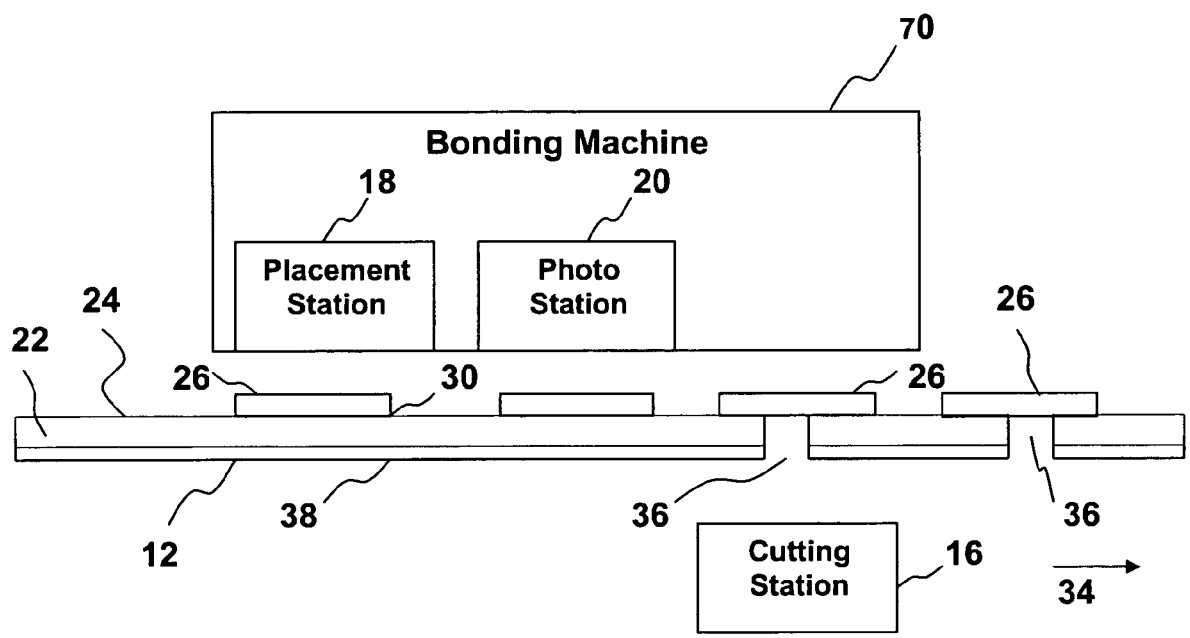
FIG. 8 shows a table of chip locations during a time sequence in accordance with the preferred embodiments.
FIG. 9 illustrates a structural representation of the cut-on-fly approach of the preferred embodiments of the invention.

Yet another example of the preferred embodiments for bond site formation is exemplified in FIGS. 8 and 9. The exemplary approach for bond site formation shown in FIGS. 8 and 9 is similar to the bond site formations discussed earlier, and in particular, to the bond site formation exemplified in FIGS. 6 and 7. That is, the bond site formation apparatus and method shown in FIGS. 8 and 9 and also in FIGS. 6 and 7, are both cut-after-placement approaches, while the bond site formation approach exemplified in FIGS. 1-3 is a cut-before-placement approach and the bond site formation method and apparatus exemplified in FIGS. 4 and 5 is a simultaneous place-and-cut approach. The bond site formation approach exemplified in FIGS. 8 and 9 differ from the approach shown in FIGS. 6 and 7 in that the chips placed in the latter example of FIGS. 8 and 9 are measured by the photo station 20 before gap formation by the cutting station 16.

As can best be seen in FIG. 9, the substrate 12 moves along a bonding machine 70 from a placement station 18 to a photo station 20 and then to a cutting station 16. The placement station 18 places each chip 26 onto the conductive layer 22 of the substrate 12 at each chip's respective bond site 30, preferably by placing a row of chips during each time period. The photo station 20 is preferably a flash vision system that measures the location of the placed chips as a check to confirm or determine that the respective chip 26 was placed at its respective bond site 30. Depending on the measured location of each chip by the photo station 20, the bonding machine 70 can adjust the cutting station 16 to accurately cut the gap 36 for the measured chip or a subsequently placed chip. As an alternative approach, the bonding machine 70 could adjust the placement station 18 to better align and register the chips with the cutting station 16. The cutting station 16 cuts the substrate 12, and in particular, the conductive layer 22 under each chip between the chip's contact points (e.g. solder bumps 46, FIG. 3) at the die attach area 28. It is understood that the cutting station 16 also cuts any flux 24 or conductive adhesive present between the conductive layer 22 and the respective chip 26 during the formation of the gap 36 to prevent any short in the antenna across the gap. This of course is also understood for the other embodiments of the invention discussed herein.

Referring to FIGS. 8 and 9, at Time 1, Chip 1 is placed at the bond site on the conductive layer 22 of the substrate 12 as the substrate continuously moves down the line along the processing direction 34. At a subsequent Time 2, Chip 1 is moved to the photo station 20, where a measurement of the chips location is made (preferably by detecting the chips front edge), and Chip 2 is placed at its respective bond site 30 on the conductive layer 22 at the next die attach area 28. At Time 3, which is subsequent to Time 2, Chip 1 is moved over the cutting station 16 and the cutting station cuts the conductive layer 22 under the chip to form the gap 36. Also at Time 3, Chip 2 is moved to the photo station 20 where a measurement of the chip's location can be made, and Chip 3 is placed at the chips respective bond site 30 on the conductive layer 22 at the next die attach area.

While not being limited to a particular theory, the bonding machine 70 determines the location to cut the gap 36 under the chips 26 based on the known speed of the web (e.g. substrate 12) moving continuously along the processing direction 34, and one or more of the following factors: (a) the known location of where the placement station 18 placed the chip onto the conductive layer 22; (b) the measurement of the chip's location by the photo station 20; and/or the pre-registered location of the flux 24 onto which the chip is placed and oriented. Of course, the speed of the web may be determined based on the displacement of the web during each time period and the time interval of each time period.

Still referring to FIGS. 8 and 9, the substrate 12 continues down the line along the processing direction 34 and at Time 4, Chip 1 is moved beyond the cutting station 16 where it can be measured by another photo station 20 for feedback, if needed, and where Chip 1 proceeds to a welding station. At the same Time 4, Chip 3 is moved above the cutting station 16, which forms the gap 36 under the chip, thereby forming the conductive gap necessary for the antenna of the tag. Moreover, Chip 3 is at the photo station 20, where, if desired, the chip can be measured, preferably by a detection of its front edge, to determine the die attach area 28 for that chip, and/or an estimate die attach area for a subsequently placed chip, as described above. Still at Time 4, the placement station 18 deposits Chip 4 at the chip's bond site 30 on the conductive layer 22. An exemplary demonstration of this chip process at time 4 is illustrated at FIG. 9, with a first chip 26 beyond the bonding machine 70, a second chip over the cutting station 16, a third chip under the photo station 20, and a fourth chip under the placement station 18.

While not being limited to a particular theory, the preferred embodiments of the invention provide at least the benefits of: less expensive tags; a high quality and high reliability integrated circuit attachment; greater output as bonding speeds compatible with flexographic printing lines are achieved by never stopping or even slowing down to do alignment; suitability for integration in current and foreseeable tag production lines is achieved by using flexographic print methodologies; and low total bond costs, for example, less than $0.01 at production volumes.

It is understood that the die attach area cut-on-fly method and apparatus described and shown are exemplary indications of preferred embodiments of the invention, and are given by way of illustration only. In other words, the concept of the present invention may be readily applied to a variety of preferred embodiments, including those disclosed herein. While the invention has been described in detail and with reference to specific examples thereof, it will be apparent to one skilled in the art that various changes and modifications can be made therein without departing from the spirit and scope thereof. For example, in FIGS. 7 and 9, the cutting station 16 could be located opposite the photo station 20 such that the chip is measured as its gap is formed. Without further elaboration the foregoing will so fully illustrate the invention that others may, by applying current or future knowledge, readily adapt the same for use under various conditions of service.

What is claimed is:

1. A method for cutting a die attach area of a substrate, comprising:
   determining a location of a first deposited chip on a moving substrate, while the substrate is moving, the chip being a die;
   cutting the substrate, while the substrate is moving, at a location of an expected subsequently placed chip to form a conductive gap based on the location of the first deposited chip; and
   depositing the subsequently placed chip on the substrate over the gap while the substrate is moving.

2. The method of claim 1, further comprising welding the subsequently placed chip to the substrate.

3. A method for cutting a die attach area of a substrate, comprising:
   determining a location of a transponder deposited at the die attach area on a continuously forward moving substrate at a first time;
   cutting the continuously forward moving substrate at the deposited transponder at a second time to form a conductive gap in the substrate in accordance with the determination; and
   wherein the transponder has conductive members in communication with the continuously forward moving substrate and the step of cutting the continuously forward moving substrate includes cutting the continuously moving substrate between the conductive members of the deposited transponder at the second time to form the conductive gap in the substrate in accordance with the determination.

4. The method of claim 3, further comprising bonding the transponder to the substrate.

5. The method of claim 3, wherein the step of determining includes registering a location of a flux at the die attach area.

6. A method for cutting a die attach area of a substrate, comprising:
   depositing a transponder at the die attach area of a moving substrate while the substrate is moving; and
   while depositing the transponder at the die attach area, cutting the moving substrate at the die attach area to form a gap adjacent and corresponding to the transponder.

7. The method of claim 6, further comprising determining an alignment of the deposited transponder on the moving substrate.

8. The method of claim 6, wherein the step of cutting the moving substrate at the die attach area to form a gap adjacent and corresponding to the transponder while depositing the transponder at the die attach area includes cutting the moving substrate at the die attach area to form a gap extending between contact points of the transponder, the contact points for conductive coupling to the moving substrate.

9. The method of claim 1, wherein the step of determining the location of the first deposited chip, which is an inoperable chip, on the substrate and the step of cutting the substrate at the location of the expected subsequently placed chip to form the conductive gap is based on the location of the first deposited chip.

* * * * *